United States Patent [19]

Yamazaki

[11] Patent Number: 4,505,950

[45] Date of Patent: Mar. 19, 1985

[54] METHOD OF MANUFACTURING A MULTIPLE-LAYER, NON-SINGLE-CRYSTALLINE SEMICONDUCTOR ON A SUBSTRATE

[76] Inventor: Shunpei Yamazaki, 21-21 Kitakarasuyama 7-chome, Setagaya-ku, Tokyo, Japan

[21] Appl. No.: 429,257

[22] Filed: Sep. 30, 1982

Related U.S. Application Data

[62] Division of Ser. No. 377,314, May 12, 1982, , which is a division of Ser. No. 177,889, Aug. 14, 1980, abandoned.

[30] Foreign Application Priority Data

Aug. 16, 1979 [JP] Japan ............................... 54-104452

[51] Int. Cl.$^3$ .............................................. B05D 5/12
[52] U.S. Cl. ..................................... 427/38; 118/50.1; 118/719; 118/729; 427/86; 427/87
[58] Field of Search ....................... 427/38, 39, 86, 87, 427/93, 95, 419.1, 419.7; 118/50.1, 723, 719, 729

[56] References Cited

U.S. PATENT DOCUMENTS

| | | | |
|---|---|---|---|
| 3,472,679 | 10/1969 | Ing et al. ................................ | 427/38 |
| 3,961,103 | 6/1976 | Aisenberg ............................. | 427/39 |
| 4,015,558 | 4/1977 | Small et al. .......................... | 118/729 |
| 4,214,926 | 7/1980 | Katsuto et al. ....................... | 427/87 |
| 4,223,048 | 9/1980 | Engle .................................... | 427/39 |
| 4,232,057 | 11/1980 | Ray et al. .............................. | 427/39 |
| 4,250,832 | 2/1981 | Ozaki .................................... | 427/38 |
| 4,282,268 | 8/1981 | Priestley et al. ..................... | 427/39 |
| 4,317,844 | 3/1982 | Carlson ................................ | 427/39 |
| 4,328,258 | 5/1982 | Coleman .............................. | 427/39 |

OTHER PUBLICATIONS

Barber "IBM Tech. Disc. Bull." vol. 11, No. 7, 12–1968, pp. 757, 758, 118–729.

*Primary Examiner*—John H. Newsome
*Attorney, Agent, or Firm*—Gerald J. Ferguson, Jr.; Joseph J. Baker

[57] ABSTRACT

A process for producing multi-layer semiconductor devices wherein a plurality of Plasma deposition chambers, an entrance and an exit chamber are provided sequentially with shutter means between them. A different layer is laid down in each chamber on a substrate as it passes sequentially through the system of chambers. During deposition, the shutters are closed. After each deposition, the Plasmas are extinguished, the chambers are evacuated or purged, the shutters are opened, the substrates are advanced to the next chamber, the chambers are refilled with the same reactant gases as previously present, the plasmas reignited and another layer deposited.

16 Claims, 1 Drawing Figure

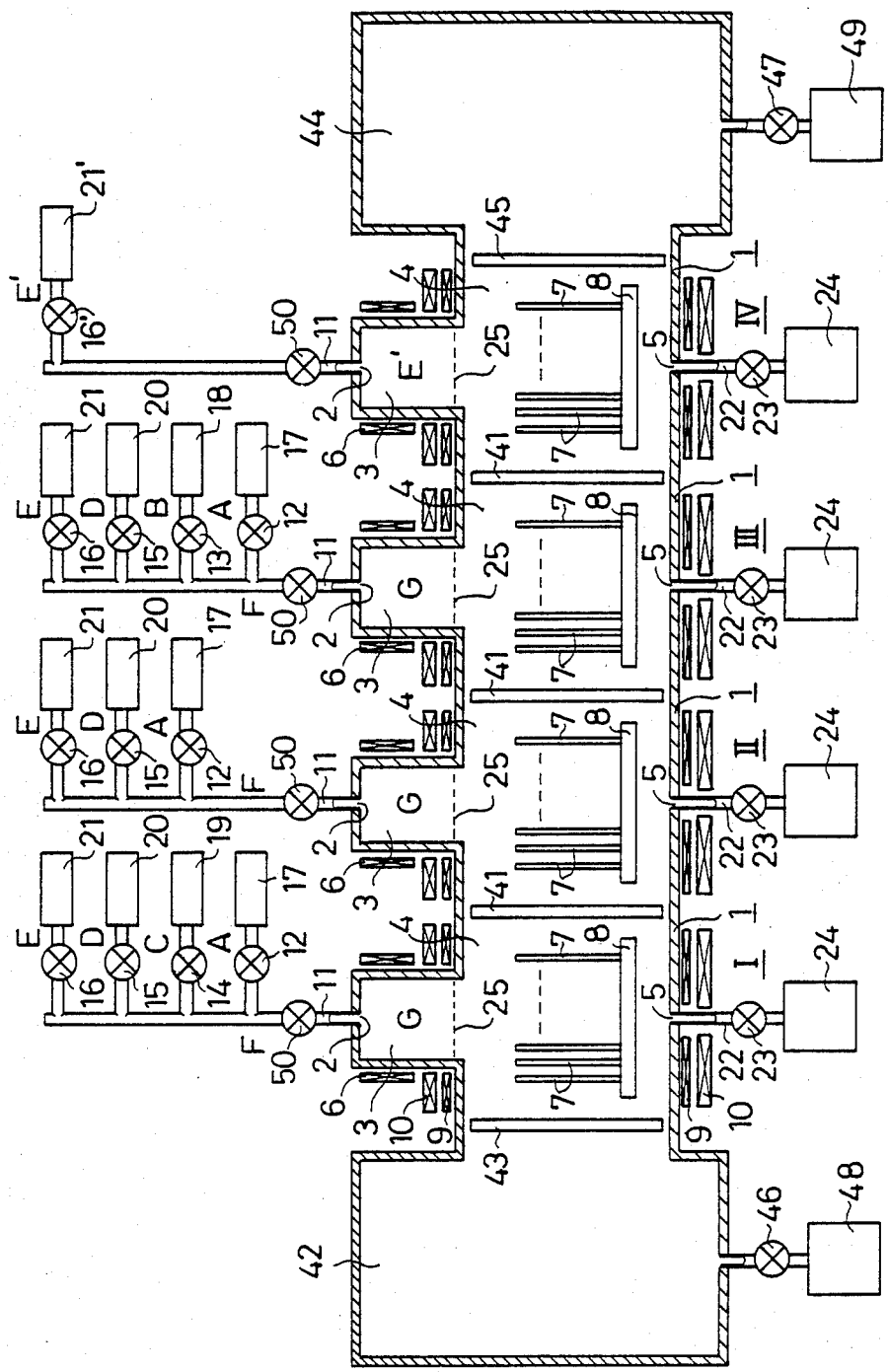

METHOD OF MANUFACTURING A MULTIPLE-LAYER, NON-SINGLE-CRYSTALLINE SEMICONDUCTOR ON A SUBSTRATE

This is a division of application Ser. No. 06/377,314 filed May 12, 1982, which is a division of application Ser. No. 06/177,889 filed Aug. 14, 1980, and Ser. No. 06/177,889 now abandoned.

BACKGROUND OF THE INVENTION

1. Field of the Invention

This invention relates to a method of manufacturing a multi-layer, a non-single-crystalline semiconductor on a substrate, and more particularly to a non-single-crystalline semiconductor manufacturing method which is of particular utility when employed in the fabrication of a semiconductor photoelectric conversion device which may be used as a solar battery.

2. Description of the Prior Art

A semiconductor photoelectric conversion device using a multi-layer, non-single-crystalline semiconductor composed of amorphous or semi-amorphous semiconductor has now been taken notice of because the each non-single-crystalline semiconductor layer may be formed thin, that is, the semiconductor material needed is small in amount and because the photoelectric conversion efficiency can be enhanced, as compared with a semiconductor photoelectric conversion device emplying a multi-layer, single crystal semiconductor.

The following method has heretofore been proposed for manufacturing a multi-layer, non-single-crystalline semiconductor layer on a substrate using following apparatus.

The apparatus for manufacturing a multi-layer, non-single-crystalline semiconductor comprises a single reaction chamber, a plurality of gas sources connected sequentially to the reaction chamber for introducing sequentially into the reaction chamber a plurality of mixture gases each containing at least a semiconductor material gas and a carrier gas, a gas ionizing means as associated with the reaction chamber for ionizing sequentially the plurality of mixture gases introduced sequentially into the reaction chamber to produce sequentially a plurality of mixture gas plasmas, a gas exhaust means connected to the reaction chamber for flowing sequentially the plurality of the mixture gas plasmas through the reaction chamber to effect sequential deposition of a plurality of semiconductor materials onto a substrate and maintaining the pressure in the reaction chamber below one atmosphere, means for maintaining the temperature of the substrate in the reaction chamber at a temperature lower than that at which single-crystallization of the deposited semiconductor materials can occur, whereby the substrate is positioned in the reaction chamber to effect the sequential deposition thereon of the plurality of semiconductor materials to fabricate the multi-layer, non-single-crystalline semiconductor.

Heretofore, the multi-layer, non-single-crystalline semiconductor has been fabricated on the substrate in the following manner using the above-described apparatus.

The substrate is disposed in the reaction chamber, and a first one of the mixture gases is introduced into the reaction chamber from a first one of the gas sources while exhausting the gas through the exhaust means. The mixture gas is ionized by the gas ionizing means into the mixture gas plasma, thereby to deposit a first one of the semiconductor materials on the substrate. In this case, the atmospheric pressure in the reaction chamber is held below one atmosphere and the substrate is maintained at a temperature lower than that at which the semiconductor material deposited on the substrate if formed as a single-crystal semiconductor layer, thereby to obtain a first one of the desired non-single-crystalline semiconductor layers on the substrate.

Next, the supply of the first mixture gas into the chamber is stopped and the gas in the chamber is exhausted by the exhaust means.

Next, a second one of the mixture gases is introduced into the chamber while at the same time exhausting gas by the exhaust means as described above. The mixture gas introduced into the chamber is ionized by the gas ionizing means to generate plasma, thereby depositing a second one of the semiconductor materials on the first non-single-crystalline semiconductor layer. In this case, the atmospheric pressure in the reaction chamber and the substrate temperature are held at the same values as mentioned above. In this way, a second one of the desired non-single-crystalline semiconductor layers is formed on the first non-single-crystalline semiconductor layer.

Thereafter, new non-single-crystalline semiconductor layers are each formed by the same method on a non-single-crystalline semiconductor layer formed immediately prior to it, by which a multi-layer, non-single-crystalline semiconductor is fabricated on the substrate.

As described above, the conventional method employs a single reaction chamber. Accordingly, the prior art method has the defect that a plurality of mixture gases must be selectively introduced into the reaction chamber in a sequential order to fabricate the multi-layer, non-single-crystalline semiconductor on the substrate. Therefore, substrates, each having formed thereon the multilayer, non-single-crystalline semiconductor on the substrate can not be mass-produced in a short time.

Further, since a portion of the gas material for the fabrication of each non-single-crystalline semiconductor layer still remains unremoved in the reaction chamber when starting the fabrication of the next non-single-crystalline semiconductor layer, it is impossible to fabricate the latter non-single-crystalline semiconductor layer of desired characteristics.

SUMMARY OF THE INVENTION

Accordingly, it is an object of the present invention to provide a novel method for manufacturing a multi-layer, non-single-crystalline semiconductor which is free from the abovesaid defects of the prior art.

The method of the present invention employs a plurality of sequentially arranged reaction chambers separated from one another by shutter means, the reaction chambers being each provided with a gas inlet and a gas outlet.

According to an aspect of the present invention a first substrate is positioned in a first one of the reaction chambers to deposit a first semiconductor material on the first substrate to form thereon a first non-single-crystalline semiconductor layer by introducing a first mixture gas containing at least a first semiconductor material gas into the first reaction chamber through the gas inlet thereof in such a state in which a gas in the first reaction chamber is exhausted therefrom through the gas outlet thereof and applying a first ionizing high-frequency electromagnetic field to the first mixture gas to ionize it into a first mixture gas plasma while at the same time passing the first mixture gas plasma into the first reaction chamber by discharging the gas in the first reaction chamber and maintaining the atmospheric pressure in the first reaction chamber below 1 atm and the temperature of the first substrate lower than that of single-crystallizing the first semiconductor material deposited on the first substrate. Then the shutter means between the first reaction chamber and a second reaction chamber adjacent thereto is displaced to permit movement of the first substrate from the first reaction chamber to the second reaction chamber while at the same time evacuating entirely the first and second reaction chambers or passing therethrough only carrier gases and positioning a second substrate in the first reaction chamber. And then a second semiconductor material is deposited on the first non-single-crystalline semiconductor layer of the first substrate to form thereon a second non-single-crystalline-semiconductor layer by introducing a second mixture gas containing at least a second semiconductor material gas into the second reaction chamber through the gas inlet thereof in such a state in which a gas in the second reaction chamber is exhausted therefrom through the gas outlet thereof and applying a second ionizing high-frequency electromagnetic field to the second mixture gas to ionize it into a second mixture gas plasma while at the same time passing the second mixture gas plasma into the second reaction chamber by discharging the gas in the second reaction chamber and maintaining the atmospheric pressure in the second reaction chamber below 1 atm and the temperature of the first substrate lower than that of single-crystallizing the second semiconductor material deposited on the first non-single-crystalline semiconductor layer, and at the same time depositing the first semiconductor material on the second substrate to form thereon the first non-single-crystalline semiconductor layer in the same manner as in the case of depositing the first non-single-crystalline semiconductor layer on the first substrate, whereby to fabricate the multi-layer, non-single-crystalline semiconductor.

According to another aspect of this invention, the manufacturing method further employs a first chamber disposed adjacent the first reaction chamber and separated therefrom by shutter means, for inserting each of the first and second semiconductor substrates into the first reaction chamber, and a second chamber disposed adjacent a last one of the reaction chambers and separated therefrom by shutter means, for taking out the multi-layer, non-single-crystalline semiconductor from the last one of the reaction chamber. And the first and second substrate are each inserted into the first chamber before being positioned in the first reaction chamber. Then the shutter means between the first chamber and the first reaction chamber is displaced to permit movement of each substrate into the first reaction chamber from the first chamber. Then the shutter means between the first and second reaction chambers and the shutter means between the first chamber and the first reaction chamber are simultaneously displaced to permit movement of the first and second substrates into the second and first reaction chambers from the first reaction chamber and the first chamber, respectively, while at the same time the shutter means between the last reaction chamber and the second chamber is displaced to permit movement of the multi-layer, non-single-crystalline semiconductor into the second chamber from the last reaction chamber. And then the multi-layer, non-single-crystalline semiconductor in the second chamber is taken out therefrom.

With above-described method of this invention, a first non-single-crystalline semiconductor layer is formed on a substrate (a first substrate) in the first reaction chamber, and the first substrate having the first non-single-crystalline semiconductor layer thus deposited thereon is transferred to the second reaction chamber, wherein a second non-single-crystalline semiconductor layer is formed on the first layer, thus obtaining a multi-layer, non-single-crystalline semiconductor on the first substrate. When the first substrate is transferred from the first reaction chamber to the second one for depositing the second non-single-crystalline layer on the first layer of the first substrate, a second substrate is brought into the first reaction chamber for depositing thereon a first non-single-crystalline semiconductor layer at the same time as the second layer is formed on the first layer of the first substrate in the second reaction chamber. Further, when the first and second substrates are transferred to the second reaction chamber and the third reaction chamber, respectively, a third substrate is introduced into the first reaction chamber, wherein it is deposited with a first non-single-crystalline semiconductor layer simultaneously with the formation of the second non-single-crystalline layer on the first layer of the second substrate in the second reaction chamber and the formation of a third non-single-crystalline semiconductor layer on the second layer of the first substrate in the third reaction chamber.

According to the method of this invention, since there is no need for selective introduction of the mixture gases into each reaction chamber in a sequential order, substrates, each having formed thereon a plurality of layers can be mass-produced in a short time.

Moreover, since each non-single-crystalline semiconductor layer is formed on each substrate in a reaction chamber for the exclusive use therefor, the layer can be formed to have predetermined characteristics.

Other objects, features and advantages will become more apparent from the following description taken in conjunction with the accompanying drawings.

BRIEF DESCRIPTION OF THE DRAWINGS

The accompanying drawing schematically shows an example of the method for making a multi-layer, non-single-crystalline semiconductor according to the present invention.

DESCRIPTION OF THE PREFERRED EMBODIMENTS

The accompanying drawing illustrates an embodiment of the method for manufacturing a multi-layer, non-single-crystalline semiconductor of the present invention, in which a P type non-single-crystalline semiconductor layer, an I type (intrinsic) non-single-crystalline semisemiconductor layer and an N type non-single-crystalline semiconductor layer are sequentially formed on each substrate in this order. For this manufacture, use is made of such an apparatus as follows:

In the drawing, four reaciton pars I, II, III and IV are formed as a unitary structure with one another. Each of the reaction part I, II, III and IV is provided with a reaction chamber 1; accordingly, the apparatus of this invention has four reaction chambers 1 as a whole.

Each reaction chamber 1 is constructed as follows: The reaction chamber has a gas inlet 2, a gas ionizing region 3, a semiconductor depositing region 4, and a gas outlet 5 which are provided in this order. Arranged arround the gas ionizing region 3 is an ionizing high-frequency power source 6 which applies to the gas ionizing region 3 an ionizing high-frequency electromagnetic field of, for example, as 1 to 10 GHz, preferable 2.46 GHz. The high-frequency power source 6 may be formed by a coil which is supplied with a high-frequency current.

Disposed around the semiconductor depositing region 4 of the reaction chamber 1 is an orientating-accelerating high-frequency power source 9 which applies to the semiconductor depositing region 4 an orientating-accelerating electric field parallel to the surfaces of the substrates 7. The electric field has a relatively low alternating frequency, for example, 1 to 100 MHz, preferably 13.6 MHz. The high-frequency power source 9 may be formed by a coil which is supplied with a high-frequency current. The high-frequency power source 9 is covered with a heating source 10 which heats the semiconductor depositing region 4 and consequently substrates 7. The heating source 10 may be a heater which is supplied with a direct current.

The four reaction chambers 1 are formed as a unitary structure with one another in such a manner that the semiconductor depositing regions 4 of adjacent one of the reaction chamber 1 intercommunicate, with a shutter 41 interposed therebetween.

The reaction chamber 1 of the reaction part I is constructed as follows:

To the gas inlet 2 of the reaction chamber 1 is connected one end of a mixture gas supply pipe 11, to which are connected a main semiconductor material compound gas source 17, a P type impurity compound gas source 19, an additional semiconductor material compound gas source 20 and a carrier gas source 21 through control valves 12, 14, 15 and 16, respectively.

From the main semiconductor material compound gas source 17 is supplied a main-semiconductor material compound gas A such as main semiconductor material hydride gas, a main semiconductor material halide gas, a main semiconductor material organic compound gas or the like. The main semiconductor material gas A is, for example, a silane ($SiH_4$) gas, a dichlorosilane ($SiH_2Cl_2$) gas, a trichlorosilane ($SiHCl_3$) gas, silicon tetrachloride ($SiCl_4$) gas, a silicon, tetrafluoride ($SiF_4$) gas or the like.

For the P type impurity compound gas source 19 is supplied a P type impurity compound gas C such as a P type impurity hydride gas, a P type impurity hydroxide gas, a P type impurity halide gas or the like. The P type impurity compound gas C is, for example, a hydride, hydroxide or halide gas of boron, aluminu, gallium, indium or the like. For instance, a diborane ($B_2H_6$) gas is supplied from the P type impurity compound gas source 19.

From the additional semiconductor material compound gas source 20 is supplied an additional semiconductor material compound gas D such as an additional semiconductor material hydroxide or halide gas of nitrogen, germanium, carbon, tin,lead or the like, for example, an $SnCl_2$, $SnCl_4$, $Sn(OH)_2$, $Sn(OH)_4$, $GeCl_4$, $NCl_3$, $PbCl_2$, $PbCl_4$, $CCl_4$, $Pb(OH)_2$, $Pb(OH)_4$ or like gas.

From the carrier gas source 21 is supplied a carrier gas E which is a gas composed of or contains a helium (He) and/or neon (Ne) gas, for example, a gas composed of the helium gas, a neon gas, or mixture gas of the helium gas or the neon gas and a hydrogen gas.

The reaction chamber 1 of the reaction part II is identical in construction with the reaction chamber 1 of the reaction part I except that the former is not provided with the P type impurity compound gas source 19 of the latter.

The reaction chamber 1 of the reaction part III is identical in construction with the reaction chamber 1 of the reaction part I except that the former is provided with an N type impurity compound gas source 18 in place of the P type one 19 of the latter.

In this case, from the N type impurity compound gas source 18 is supplied an N type impurity compound gas B such as an N type impurity hydride gas, an N type impurity halide gas, N type impurity hydroxide gas or the like, for example, a hydride, halide or hydroxide gas of nitrogen, phosphorus, arsenic, antimony, tellurium or the like. The N type impurity compound gas B is, for exaple, a phosphine ($PH_3$) gas, an arsine ($AsH_3$) gas or the like.

The reaction chamber 1 of the reaction part IV has only a carrier gas source 21'. In this case, the carrier gas source 21' supplies a carrier gas E' which is a selected one or more of helium gas, neon gas and hydrogen gas.

In each of the reaction parts I to IV, the mixture gas supply pipe 11 has a control valve 50 on the side of the reaciton chamber 1.

In each of the reaction parts I to IV, to the gas outlet 5 of the reaction chamber 1 is connected one end of a gas outlet pipe 22, which is connected at the other end to an exhauster 24 through a control valve 23. The exhauster 24 may be a vacuum pump which evacuates the gas in the reaction chamber 1 through the control valve 23 and the gas oulet tube 22.

In each of the reaction parts I to IV a gas homogenizer 25 may be provided midway between the gas ionizing region 3 and the semiconductor depositing region 4 in the reaction chamber 1.

The reaction part I communicates, on the opposite side from the reaction part II, with a chamber 42, with a shutter 43 interposed therebetween. The chamber 42 is provided for inserting into the semiconductor depositing region 4 of the reaction part I the boat 8 having planted thereon the substrates 7 to be deposited with non-single crystalline semiconductor layers.

The reaction part IV communicates, on the opposite side from the reaction part III, with chamber 44, with a shutter 45 interposed therebetween. The chamber 44 is provided for taking out from the semiconductor depositing region 4 the boat 8 having planted thereon the substrates 7 deposited with the non-single-crystalline semiconductor layers.

The chambers 42 and 44 have connected thereto respectively via control valves 46 and 47 exhausters 48 and 49 similar to the aforesaid one 24.

The above is a description of an example of the apparatus for forming a multi-layer, non-single-crystalline semiconductor on a substrate according to this invention.

With the manufacturing method of this invention, it is possible to form on a substrate a multi-layer, non-single-crystalline semiconductor consisting of P type, I type and N type non-single-crystalline semiconductor layers in the manner described below through utilization of such an apparatus as described above.

The boat 8 as of quartz having planted thereon a plurality of parallel substrates 7, which is placed beforehand in the chamber 42 evacuated by the exhauster 48, is inserted into the semiconductor depositing region 4 of the reaction part I, opening the shutter 43. The insertion of the boat 8 is carried out in such a state in which the reaction part I is entirely evacuated or only the carrier gas E flows into the reaction part I.

In this case, the substrates 7 may be conductive metal substrates as of stainless steel, titanium, titanium nitride or the like; semiconductor substrates as of silicon, silicon oxide, germanium or the like; insulating substrates as of alumina, glass, epoxy resin, polyimido resin or the like; substrates, each having a tin oxide, indium oxide, titanium oxide or like light-transparent, conductive oxide layer formed on an insulating base plate; substrates, each having a conductive metal layer formed on an insulating base plate; or substrates, each having an N or P type semiconductor layer in a single or multi-layer form on an insulating base plate.

As described above, the substrates 7 are place in the semiconductor depositing region 4 of the reaction chamber 1 of the reaction part I and, in the state in which the gas in the reaction chamber 1 of the reaction part I is exhausted by the exhauster 24 through the gas outlet 5, the gas outlet pipe 22 and the control valve 23 of the reaction Part I, a mixture gas F containing the main semiconductor material compound gas A available from the main semiconductor material compound gas source 17 via the control valve 12, the P type impurity compound gas C available from the P type impurity compound gas source 19 via the control valve 14, the additional semiconductor material compound gas C available from the additional semiconductor material compound gas source 20 via the control valve 15, and the carrier gas E available from the carrier gas source 21 via the control valve 16 is introduced into the gas ionizing region of the reaction chamber 1 via the gas inlet 2. The amount of the carrier gas E contained in the mixture gas F may be 5 to 99 flow rate %, in particular, 40 to 90 flow rate % relative to the mixture gas F.

A high-frequency electromagnetic field is applied by the ionizing, high-frequency power source 6 to the mixture gas F introduced into the gas ionizing region 3 of the reaction part I by which the mixture gas F is ionized into a plasma, thus forming a mixture gas plasma G in the gas ionizing region 3 of the reaction part I. In this case, the high-frequency electromagnetic field may be one that has a 10 to 300 W high-frequency energy having a frequency of 1 to 100 GHz, for example, 2.46 GHz.

Since the electromagnetic field employed for ionizing the mixture gas F into the mixture gas plasma G in the gas ionizing region 3 of the reaction part I is a microwave electromagnetic field and has such a high frequency as mentioned above, the ratio of ionizing the mixture gas F into the mixture gas plasma G is high. The mixture gas plasma G contains a carrier gas plasma into which the carrier gas contained in the mixture gas F is ionized and a main semiconductor material compound gas plasma into which the semiconductor compound gas is ionized.

The same is true of the case where the additional semiconductor material compound gas D and P type impurity compound gas C are contained in the mixture gas F and ionized into its gas plasma.

The mixture gas plasma G thus formed is flowed into the semiconductor depositing region 4 of the reaction part I through the gas homogenizer 25 by exhausting the gas in the reaction chamber 1 of the reaction part I by means of the exhauster 24 through the gas outlet 5, the gas outlet pipe 22 and the control valve 23 of the reaction part I.

By flowing the mixture gas plasma G into the semiconductor depositing region 4 of the reaction part I, a P type semiconductor material is deposited on the substrates 7 placed in the semiconductor depositing region 4 of the reaction part I. In this case, the flow rate of the mixture gas F introduced into the reaction chamber 1, especially the flow rate of the carrier gas E contained in the mixture gas F is controlled beforehand by the adjustment of the control valve 16 and the flow rate of the gas exhausted from the reaction chamber 1 through the gas outlet 5 is controlled in advance by adjustment of the control valve 23, by which the atmospheric pressure in the reaction chamber 1 is held below 1 atm. Moreover, the substrates 7 are maintained at a relatively low temperature under a temperature at which semiconductor layers deposited on the substrates become crystallized, for example, in the range from the room temperature to 700° C. In the case of maintaining the substrates 7 at room temperature, the heating source 10 need not be used, but in the case of holding the substrates 7 at a temperature higher than the room temperature, the heating source 10 is used to heat the substrates 7. Furthermore, the deposition of the P type semiconductor material on the substrates 7 is promoted by the orientating-accelerating electric field established by the orientating-accelerating high-frequency source 9 in a direction parallel to the surfaces of the substrates 7.

As described above, by depositing the P type semiconductor material on the substrates 7 in the semiconductor depositing region 4 in the state in which the atmospheric pressure in the reaction chamber 1 is held low and the substrates 7 are held at a relatively low temperature, desired P type non-single-crystalline semiconductor layers are formed on the substrates 7.

In this case, the mixture gas plasma in the semiconductor depositing region 4 of the reaction part I is the mixture plasma having flowed thereinto from the gas ionizing region 3, and hence is substantially homogeneous in the semiconductor depositing region 4. Consequently, the mixture gas plasma is substantially homogeneous over the entire surface of each substrate 7.

Accordingly, it is possible to obtain on each substrate 7 a P type non-single-crystalline semiconductor layer which is homogeneous in the direction of its surface and has substantially no or a negligibly small number of voids. Moreover, even if P type non-single-crystalline semiconductor layer are individually formed on a number of substrates 7 concurrently as shown, the non-single-crystalline semiconductor layers can be made without dispersion in their property; accordingly, P type non-single-crystalline semiconductor layers of good quality can be mass produced.

Thereafter, the boat 8 carrying the substrates 7 respectively deposited with the P type non-single-crystalline semiconductor layers is inserted into the semiconductor depositing region 4 of the reaction part II, with the shutter 41 opened. This insertion of the boat 8 is carried out in such a state in which the reaction parts I and II are entirely evacuated or only the carrier gas E flows therein. In the semiconductor depositing region 4 an I type non-single-crystalline semiconductor layer is formed on the P type non-single-crystalline semiconductor layer of each substrate 7 in the same manner as described previously in respect of the fabrication of the P type non-single-crystalline semiconductor layer.

Following this, the boat 8 carrying the substrates 7, each having formed thereon the P type non-single-crystalline semiconductor layer and the I-type non-single-crystalline semiconductor layer in this order, is inserted from the reaction part II into the semiconductor depositing region 4 of the reaction part III, with the shutter 41 opened. Also in this case, the boat 8 is inserted into the reaction part III in such a state in which the reaction parts II and III are entirely evacuated or only the carrier gas E flows therein.

In the semiconductor depositing region 4 of the reaction part III an N type non-single-crystalline semiconductor layer is deposited on the I type non-single-crystalline semiconductor layer of each substrate 7 in the same manner as described previously with reference to the fabrication of the P type non-single-crystalline semiconductor layer.

Then, the boat 8 which carries the substrates 7, each having formed thereon the P type, I type and N type non-single-crystalline semiconductor layers in this order, is inserted from the reaction part III into the semiconductor depositing region 4 of the reaction part IV, with the shutter 41 opened. In this case, the boat 8 is inserted into the reaction part IV in such a state in which the reaction parts III and IV are entirely evacuated or only the carrier gases E' are passed thereinto.

In the semiconductor depositing region 4 of the reaction part IV the P, I and N type non-single-crystalline semiconductor layers formed on each substrate 7 are annealed by a carrier gas plasma into which the carrier gas E' is ionized in the gas ionizing region 3.

Thereafter, the boat 8 carrying the substrates, each deposited with the P, I and N type non-single-crystalline layers, is inserted into the chamber 44 from the reaction part IV, with the shutter 45 opened. In this case, the reaction part IV is entirely evacuated or only the carrier gas E' is passed thereinto.

Then, the substrates 7 having thus deposited thereon the P, I and N type non-single-crystalline semiconductor layers are taken out from the chamber 44.

In accordance with the above embodiment of the present invention, it is possible to form on the substrate 7 a non-single-crystalline semiconductor multi-layer structure which has substantially no voids or, if any, a negligibly small number of voids and is homogeneous in the direction of its surface. That is, for example, a non-single-crystalline silicon layer as one of the layers can be formed on the substrate; further, an N type non-single-crystalline silicon layer can be formed as one of the layers which contains an N type impurity as of nitrogen, phosphorus, arsenic, antimony or tellurium; moreover, a P type non-single-crystalline silicon layer can also be formed as one of the layers which contains a P type impurity as of boron, aluminum, gallium or indium; furthermore, a non-single-crystalline compound semiconductor layer can also be formed as one of the layers which is composed of, for example, silicon and nitrogen, germanium, carbon, tin or lead; in addition, a non-single-crystalline compound semiconductor layer can also be formed as one of the layers which is expressed by, for example, $Si_3N_{4-x}(0<x<1)$, $Si_xGe_{1-x}(0<x<1)$, $Si_xC_{1-x}(0<x<1)$, $Si_xSn_{1-x}(0<x<1)$ or $Si_xPb_{1-x}(0<x<1)$; besides, an N or P type non-single crystalline compound semiconductor layer can also be formed as one of the layers in which the above-said non-single-crystalline compound semiconductor layer contains the abovesaid N or P type impurity. It is also possible to form a non-single-crystalline compound semiconductor layer as one of the layers whose composition ratio continuously varies in its thickwise direction. Furthermore, it is also possible to form a non-single-crystalline semiconductor layer as one of the layers whose composition ratio continuously varies from the composition ratio of a non-single-crystalline silicon layer to that of a non-single-crystalline compound semiconductor layers. Also it is possible to form a non-single-crystalline semiconductor multi-layer which has formed therein one or more PN or heterojunctions.

It will be apparent that many modifications and variations may be effected without departing from the scope of the novel concepts of this invention.

What is claimed is:

1. A multi-layer, non-single-crystal semiconductor manufacturing method which employs a plurality of sequentially arranged reaction chambers separated from one another by normally closed shutter means, the reaction chambers being each provided with a gas inlet and a gas outlet, said method comprising the steps of:

positioning a first substrate in a first one of the reaction chambers;

depositing a first silicon compound including hydrogen or a halogen on the first substrate to form thereon a first non-single-crystal silicon layer of either one of N and P conductivity types by introducing a first gas mixture containing at least a gas of said first silicon compound and either one of N and P conductivity type impurity compound gases into the first reaction chamber through the gas inlet thereof in such a state that gas in the first reaction chamber is exhausted therefrom through the gas outlet thereof and by applying a first ionizing high-frequency electromagnetic field to the first gas mixture to ionize it into a first gas mixture plasma while at the same time passing the first gas mixture plasma into the first reaction chamber by discharging the gas in the first reaction chamber and maintaining the atmospheric pressure in the first reaction chamber below 1 atm and the temperature of the first substrate below 700° C. which is lower than that for single-crystallizing the first silicon deposited on the first substrate;

displacing the shutter means between the first reaction chamber and a second reaction chamber adjacent thereto and moving the first substrate from the first reaction chamber to the second reaction chamber and positioning a second substrate in the first reaction chamber while at the same time evacuating entirely the first and second reaction chambers or passing therethrough only carrier gases and then closing the shutter means between the first and second reaction chambers;

depositing a second silicon compound including hydrogen or a halogen on the first non-single-crystal silicon compound layer of the first substrate to form thereon a second non-single-crystal silicon compound layer of I conductivity type by introducing at least a gas of said second silicon compound into the second reaction chamber through the gas inlet thereof in such a state that gas in the second reaction chamber is exhausted therefrom through the gas outlet thereof and by applying a second ionizing high-frequency electromagnetic field to the second silicon gas to ionize it into a second gas plasma while at the same time passing the second gas plasma into the second reaction chamber by discharging the gas in the second reaction chamber and maintaining the atmospheric pressure in the second reaction chamber below 1 atm and the temperature of the first substrate below 700° C. which is lower than that for single-crystallizing the second silicon deposited on the first non-single-crystal silicon layer, and at the same time depositing the first silicon compound material on the second substrate to form thereon the first non-single-crystal silicon compound layer in the same manner as in the case of depositing the first non-single-crystal silicon layer on the first substrate;

displacing the shutter means between the second reaction chamber and a third reaction chamber adjacent thereto and the shutter means between the first and second reaction chamber and moving the first and second substrates from the second and first reaction chambers to the third and second reaction chambers, respectively, and positioning a third substrate in the first reaction chamber while at the same time evacuating entirely the first, second and third reaction chambers or passing therethrough only carrier gases and then closing the shutter means between the first and second reaction chambers and the shutter means between the second and third reaction chambers; and depositing a third silicon compound including hydrogen or a halogen on the second non-single-crystal silicon compound layer of the first substrate to form thereon a third non-single-crystal silicon compound layer of the other one of N type and P type conductivity types by introducing a third gas mixture containing at least a gas of said third silicon compound and the other one of N and P type conductivity type impurity compound gases into the third reaction chamber through the gas inlet thereof in such a state that gas in the third reaction chamber is exhausted therefrom through the gas outlet thereof and by applying a third ionizing high-frequency electromagnetic field to the third gas mixture to ionize it into a third gas mixture plasma while at the same time passing the third mixture plasma into the third reaction chamber by discharging the gas in the third reaction chamber and maintaining the atmospheric pressure in the third reaction chamber below 1 atm and the temperature of the first substrate below 700° C. which is lower than that for single-crystallizing the second silicon deposited on the second non-single-crystal silicon layer, and at the same time depositing the first and second silicon on the third and second substrates to form thereon the first and second non-single-crystal silicon layers, respectively, in the same manner as in the case of depositing the first and second non-single-crystal silicon layers on the second and first substrates, respectively, whereby to fabricate multi-layer, non-single-crystal semiconductors having a PIN junction and in each step while a shutter is open between adjacent chambers, no plasma is energized in those chambers.

2. A multi-layer, non-single-crystal semiconductor manufacturing method according to claim 1, which further employ a first chamber disposed adjacent the first reaction chamber and separated therefrom by shutter means, for inserting each of the first, second and third semiconductor substrates into the first reaction chamber, and a second chamber disposed adjacent a last one of the reaction chambers and separated therefrom by shutter means, for taking out the multi-layer, non-single-crystal semiconductor from the last one of the reaction chambers, and wherein the first, second and third substrates are each inserted into the first chamber before being positioned in the first reaction chamber; the shutter means between the first chambre and the first reaction chamber is displaced to permit movement of each substrate into the first reaction chamber from the first chamber; the shutter means between the second and third reaction chambers, the shutter means between the first and second reaction chambers and the shutter means between the first chamber and the first reaction chamber are simultaneously displaced to permit movement of the first, second and third substrates into the third, second and first reaction chambers from the second and first reaction chamber and the first chamber, respectively, while at the same time the shutter means between the last reaction chamber and the second chamber is displaced to permit movement of the multi-layer, non-single-crystal semiconductor into the second chamber from the last reaction chamber; and then the multi-layer, non-single-crystal semiconductor in the second chamber is taken out therefrom.

3. A multi-layer, non-single-crystal semiconductor manufacturing method according to claim 1 or 2, wherein the first gas mixture, the second gas and third gas mixture plasmas in the first, second and third reaction chamber are each orientated and accelerated by a high-frequency or DC electric field towards the substrate.

4. A multi-layre, non-single-crystal semiconductor manufacturing method according to claim 1 or 2, wherein the first, second and third ionizing high-frequency electromagnetic field are each a micro-wave electromagnetic field and in each step while a shutter is open between adjacent chambers, no plasma is energized in those chambers.

5. A multi-layer, non-single-crystal semiconductor manufacturing method which employs a plurality of sequentially arranged reaction chambers separated from one another by normally closed shutter means, the reaction chambers being each provided with a gas inlet and a gas outlet, said method comprising the steps of:

positioning a first substrate in a first one of the reaction chambers;

depositing either one of (a) first silicon compound including hydrogen or a halogen or (b) a semiconductor compound material of a second silicon compound including hydrogen or a halogen and an additional semiconductor material of N, Ge, C, Sn or Pb on the first substrate to form thereon either one of a non-single-crystal silicon layer and a non-single-crystal semiconductor compound layer of the second silicon and the additional semiconductor material by introducing either one of a gas of said first silicon compound or a gas mixture of gas of said second silicon compound and an additional semiconductor material compound gas of the additional semiconductor material of N, Ge, C, Sn, or Pb into the first reaction chamber through the gas inlet thereof in such a state that gas in the first reaction chamber is exhausted therefrom through the gas outlet thereof and by applying a ionizing high-frequency electromagnetic field to either one of the first silicon gas or the gas mixture to ionize it into either one of a silicon gas plasma or a gas mixture plasma while at the same time passing either one of the silicon gas plasma or the gas mixture plasma into the first reaction chamber by discharging the gas in the first reaction chamber and maintaining the atmospheric pressure in the first reaction chamber below 1 atm and the temperature of the first substrate below 700° C. which is lower than that for single-crystallizing either one of the first silicon compound or the second silicon compound and the additional semiconductor material deposited on the first substrate;

displacing the shutter means between the first reaction chamber and a second reaction chamber adjacent thereto and moving the first substrate from the first reaction chamber to the second reaction chamber and positioning a second substrate in the first reaction chamber while at the same time evacuating entirely the first and second reaction chambers or passing therethrough only carrier gases and then closing the shutter means between the first and second reaction chambers;

depositing the other one of the first silicon compound or the second silicon compound and the additional semiconductor material on the layer deposited in the first reaction chamber in the same manner the layer in the first reaction chamber was formed, and at the same time depositing on the second substrate the same material that was deposited on on the first substrate in the first reaction chamber to thereby fabricate multi-layer, non-single-crystal semiconductors having a hetero junction.

6. A multi-layer, non-single-crystal semiconductor manufacturing method according to claim 5, which further employ a first chamber disposed adjacent the first reaction chamber and separated therefrom by shutter means, for inserting each of the first and second semiconductor substrates into the first reaction chamber, and a second chamber disposed adjacent a last one of the reaction chambers and separated therefrom by shutter means, for taking out the multi-layer, non-single-crystal semiconductor from the last one of the reaction chambers, and wherein the first and second substrates are each inserted into the first chamber before being positioned in the first reaction chamber; the shutter means between the first chamber and the first reaction chamber is displaced to permit movement of each substrate into the first reaction chamber from the first chamber; the shutter means between the first and second reaction chambers and the shutter means between the first chamber and the first reaction chamber are simultaneously displaced to permit movement of the first and second substrates into the second and first reaction chambers from the first reaction chamber and the first chamber, respectively, while at the same time the shutter means between the last reaction chamber and the second chamber is displaced to permit movement of the multi-layer, non-single-crystal semiconductor into the second chamber from the last reaction chamber; and then the multi-layer, non-single-crystal semiconductor in the second chamber is taken out therefrom.

7. A multi-layer, a non-single-crystal semiconductor manufacturing method according to claim 5 or 6, wherein the first silicon gas plasma and the gas mixture plasmas in the first and second reaction chambers are each orientated and accelerated by a high-frequency or DC electric field towards the substrate.

8. A multi-layer, non-single-crystal semiconductor manufacturing method according to claim 5 or 6, wherein the ionizing high-frequency electromagnetic field are each a micro-wave electromagnetic field.

9. A multi-layer, non-single-crystalline semiconductor manufacturing method according to claim 5 or 6, wherein the non-single-crystal semiconductor compound layer is stoichiometrically identical in composition in the direction of its surface but different the direction of its thickness.

10. A multi-layer, non-single-crystal semiconductor manufacturing method according to claim 5 or 6, wherein the first silicon gas and the gas mixture contain first and second compound gases of first and second impurities for imparting first and second conductivity types to the non-single-crystal silicon layer and the non-single-crystal semiconductor compound layer, respectively, thereby to form the non-single-crystal silicon layer of one of N, P and I conductivity types and the non-single-crystal semiconductor compound layer of one of the remaining two conductivity types.

11. A multi-layer, non-single-crystal semiconductor manufacturing method which employs a plurality of sequentially arranged reaction chambers separated from one another by normally closed shutter means, the reaction chambers being each provided with a gas inlet and a gas outlet, said method comprising the steps of:

positioning a first substrate in a first one of the reaction chambers;

depositing a first semiconductor compound material of a first silicon compound including hydrogen or a halogen and a first additional semiconductor material of N, Ge, C, Sn or Pb on the first substrate to form thereon a first non-single-crystal semiconductor compound layer of the first silicon compound and the first additional semiconductor material by introducing a first gas mixture of a gas of said first silicon compound and a first additional semiconductor material compound gas of the first additional semiconductor material into the first reaction chamber through the gas inlet thereof in such a state that gas in the first reaction chamber is exhausted therefrom through the gas outlet thereof and by applying a first ionizing high-frequency electromagnetic field to the first gas mixture to ionize it into a first gas mixture plasma while at the same time passing the first gas mixture plasma into the first reaction chamber by discharging the gas in the first reaction chamber and maintaining the atmospheric pressure in the first reaction chamber below 1 atm and the temperature of the first substrate below 700° C. which is lower than that for single-crystallizing the first semiconductor compound material deposited on the first substrate;

displacing the shutter means between the first reaction chamber and a second reaction chamber adjacent thereto and moving the first substrate from the first reaction chamber to the second reaction chamber and positioning a second substrate in the first reaction chamber while at the same time evacuating entirely the first and second reaction chambers or passing therethrough only carrier gases and then closing the shutter means between the first and second reaction chambers;

depositing second semiconductor compound material of a second silicon compound including hydrogen or a halogen and the first additional semiconductor-material of N, Ge, C, Sn or Pb on the first non-single-crystal semiconductor compound layer to form thereon a second non-single-crystal semiconductor compound layer of the second silicon compound and the second additional semiconductor material by introducing a second gas mixture of a gas of the second silicon compound and the second additional semiconductor material compound gas of the second additional semiconductor material into the second reaction chamber through the gas inlet thereof in such a state that gas in the second reaction chamber is exhausted therefrom through the gas outlet thereof and by applying a second ionizing high-frequency electromagnetic field to the second gas mixture to ionize it into a second gas mixture plasma while at the same time passing the second gas mixture plasma into the second reaction chamber by discharging the gas in the second reaction chamber and maintaining the atmospheric pressure in the second reaction chamber below 1 atm and the temperature of the first substrate below 700° C. which is lower than that for single-crystallizing the second semiconductor compound material deposited on the first substrate; and at the same time depositing the first semiconductor compound material on the second substrate to form thereon the first non-single-crystal semiconductor compound layer in the same manner as in the case of depositing the first non-single-crystal semiconductor compound layer on the first substrate; whereby to fabricate multi-layer, non-single-crystal semiconductors having a hetero junction and in each step while a shutter is open between adjacent chambers, no plasma is energized in those chambers.

12. A multi-layer, non-single-crystal semiconductor manufacturing method according to claim 11, which further employ a first chamber disposed adjacent the first reaction chamber and separated therefrom by shutter means, for inserting each of the first and second semiconductor substrates into the first reaction chamber, and a second chamber disposed adjacent a last one of the reaction chambers and separated therefrom by shutter means, for taking out the multi-layer, non-single-crystal semiconductor from the last one of the reaction chambers, and wherein the first and second substrates are each inserted into the first chamber before being positioned in the first reaction chamber; the shutter means between the first chamber and the first reaction chamber is displaced to permit movement of each substrate into the first reaction chamber from the first chamber; the shutter means between the first and second reaction chambers and the shutter means between the first chamber and the first reaction chamber are simultaneously displaced to permit movement of the first and second substrates into the second and first reaction chambers from the first reaction chamber and the first chamber, respectively, while at the same time the shutter means between the last reaction chamber and the second chamber is displaced to permit movement of the multi-layer, non-single-crystal semiconductor into the second chamber from the last reaction chamber; and then the multi-layer, non-single-crystal semiconductor in the second chamber is taken out therefrom.

13. A multi-layer, non-single-crystal semiconductor manufacturing method according to claim 11 or 12, wherein the first and second gas mixture plasmas in the first and second reaction chamber are each orientated and accelerated by a high-frequency or DC electric field towards the substrate.

14. A multi-layre, non-single-crystal semiconductor manufacturing method according to claim 11 or 12, wherein the first and second ionizing high-frequency electromagnetic field are each a microwave electromagnetic field.

15. A multi-layer, non-single-crystalline semiconductor manufacturing method according to claim 11 or 12, wherein the first and second non-single-crystal semiconductor compound layers are each stoichiometrically identical in composition in the direction of its surface but different the direction of its thickness.

16. A multi-layer, non-single-crystal semiconductor manufacturing method according to claim 11 or 12, wherein the first and second gas mixture contain first and second compound gases of first and second impurities for imparting first and second conductivity types to the first and second non-single-crystal semiconductor compound layers, respectively, thereby to form the first and second non-single-crystal semiconductor compound layers of one of N, P and I conductivity type and one of the remaining two conductivity types, respectively.

* * * * *